United States Patent [19]

Hasuo et al.

[11] Patent Number: 4,713,562
[45] Date of Patent: Dec. 15, 1987

[54] JOSEPHSON-JUNCTION LOGIC CIRCUIT

[75] Inventors: Shinya Hasuo; Norio Fujimaki, both of Yokohama, Japan

[73] Assignee: Fujitsu Limited, Kawasaki, Japan

[21] Appl. No.: 910,301

[22] Filed: Sep. 22, 1986

Related U.S. Application Data

[63] Continuation of Ser. No. 820,587, Jan. 21, 1986, abandoned, which is a continuation of Ser. No. 363,862, Mar. 31, 1982, abandoned.

[30] Foreign Application Priority Data

| Mar. 31, 1981 | [JP] | Japan | 56-46392 |
| Jun. 30, 1981 | [JP] | Japan | 56-102859 |
| Dec. 28, 1981 | [JP] | Japan | 56-215711 |

[51] Int. Cl.$^4$ .......................... H03K 19/195
[52] U.S. Cl. .................. 307/462; 307/471; 307/476; 307/306; 357/5
[58] Field of Search ............ 307/306, 462, 471, 476; 357/5; 365/162

[56] References Cited

PUBLICATIONS

H. H. Zappe, "Josephson Quantum Interference Computer Devices", IEEE Transactions on Magnetics, vol. MAG-13, No. 1, Jan. 1977, pp. 41-47.

*Primary Examiner*—John Zazworsky
*Attorney, Agent, or Firm*—Staas & Halsey

[57] ABSTRACT

A Josephson-junction logic circuit comprises at least one Josephson-junction logic gate which has a variable threshold-type superconductive quantum interference element. The Josephson-junction logic gate comprises a superconductive inductance loop, and at least two Josephson junctions included in the superconductive loop. At least two current-injection lines connected to the superconductive loop and at least one magnetically coupled line are provided. The magnetically coupled line is placed so as to be magnetically coupled to the inductance. Because of this construction, the number of inputs can be increased. Also, various logical functions can be obtained. Further, various logic circuits can be formed by simply changing the photomask for the wiring between the gates.

13 Claims, 28 Drawing Figures

AND $(A_1+A_2) \cdot (B_1+B_2) \cdot (C_1+C_2)$

ENOR

OR

AND

JOSEPHSON-JUNCTION LOGIC CIRCUIT

CROSS REFERENCE TO RELATED APPLICATIONS

This is a continuation application of co-pending U.S. application Ser. No. 820,587, filed Jan. 21, 1986, now abandoned, which is a continuation of U.S. application Ser. No. 363,862, filed Mar. 31, 1982, now abandoned.

BACKGROUND OF THE INVENTION

The present invention relates to a Josephson-junction logic circuit and more specifically to a Josephson-junction logic circuit based on SQUID (superconductive quantum interference devices) having nonlinear threshold characteristics.

Conventional Josephson logic gates consisting of multi-junction superconducting quantum interference devices can be divided into two types, i.e., a type with a magnetically coupled gate having magnetically coupled control lines as disclosed in U.S. Pat. No. 3,978,351 and a type with a current-injection gate in which the input current is allowed to flow directly into a loop of the quantum interference device as disclosed in U.S. Pat. No. 4,117,354. In the magnetically coupled type gate, an input current is fed to the magnetically coupled control lines to change the magnetic field coupled with the loop of the SQUID, whereby the critical current of the gate is changed, and the superconductive state is switched to the voltage state. In the magnetically coupled gate, however, each of the input currents that is fed to the magnetically-coupled control lines independently change the critical current. Namely, input sensitivity is low and the operation margin is small. The current injection-type gate, in which the input current is allowed to flow directly into the loop of the gate, utilizes such a phenomenon that the superconductive state is switched to the voltage state when the input current exceeds a threshold value. The current-injection type gate has nonlinear threshold characteristics, and its boundary between the superconductive state and the voltage state changes more rapidly than that of the magnetically coupled gate, making it possible to improve the operation margin. This type of gate, however, has a limitation in the number of inputs. The number of inputs is two in the case of a two-junction interference device of a current-injection type having a large operation margin.

On the other hand, both types of the conventional Josephson-junction logic gates are effective for obtaining a logic sum (OR) or logic product (AND), respectively. However, in order to obtain a functional gate such as an exclusive NOR gate (ENOR gate) by utilizing conventional Josephson-junction logic gates, several Josephson-junction-logic gates are needed.

Further, conventional Josephson logic gates, such as AND gates and OR gates, have different constructions. That is, the OR gate consists of a magnetically coupled gate, and the AND gate having a large operation margin consists of a current-injection type gate. In the Josephson logic circuits which are constructed by using a number of various logic gates, the logic gates must be arrayed in a different manner for each of the circuits. In manufacturing the Josephson logic circuits, therefore, photomasks for patterning electrodes and insulation layers must be prepared in all the manufacturing steps for each of the Josephson logic circuits that are to be produced, thereby making it difficult to correct or modify the Josephson logic circuits.

SUMMARY OF THE INVENTION

In view of the defects inherent in the above-mentioned conventional art, an object of the present invention is to increase the number of inputs for the Josephson-junction logic gate, without seriously impairing the input sensitivity, by adding magnetically coupled control lines for injecting input signals to a multi-junction interference device of a current-injection type.

Another object of the present invention is to provide an ENOR gate consisting of a single Josephson-junction logic gate.

Further, still another object of the present invention is to provide a Josephson-junction logic circuit in which the logic gates are commonly arrayed and which makes it possible to form different logic circuits by simply changing the photomask for patterning the wiring layer.

In order to obtain the above objects, there is provided a Josephson-junction logic circuit comprising: a Josephson-junction logic gate having a superconductive inductance loop, at least two Josephson junctions included in the superconductive loop; at least two current-injection lines, each of the current-injection lines being supplied with a signal current and the signal current being injected into the superconductive inductance loop; and, at least one magnetically coupled line placed so as to be magnetically coupled to the superconductive inductance loop.

According to one aspect of the invention, in the Josephson-junction logic gate the number of Josephson junctions is two, the Josephson junctions have a substantially equal critical current, the number of current-injection lines is two, the current-injection lines are adapted to conduct a first and a second input signal current, the current-injection lines are connected at both ends of the inductance, the number of magnetically coupled lines is one, and the magnetically coupled line is adapted to conduct a third input signal current, whereby a logic product is obtained from the first, second, and third signals.

According to still another aspect to the invention, in the Josephson-junction logic gate, the number of the Josephson junctions is two, the Josephson junctions have critical currents at a ratio of substantially 1 to 3, the number of current-injection lines is two, the current-injection lines are connected at points that divide the inductance at a ratio of substantially 3 to 1, the current-injection lines are adapted to receive a first input signal A and a second input signal B, the number of magnetically coupled control lines is one, and the magnetically coupled control line is adapted to receive a third input signal C, whereby a logic product $A \cdot B \cdot \overline{C}$ is obtained from the first, second, and third input signals A, B, and C.

Further, according to still another aspect of the invention, in the Josephson-junction logic gate the number of Josephson junctions is two, the Josephson junctions have a substantially equal critical current, the number of the current-injection lines is two, the current-injection lines are connected at both ends of the inductor, the number of magnetically coupled lines is one, the magnetically coupled line and the half-way point of the inductance are adapted to receive a first and a second timing pulse current, respectively, and the current-injection lines are adapted to receive a first and a second input signals, respectively, after the timing pulse currents are supplied to the magnetically coupled line and the inductance, whereby a logic exclusive NOR is obtained from the first and second input signals.

In addition, according to still another aspect of the invention, each of the Josephson-junction logic gates has at least three input ends and at least one output end, a combination of at least two of the three input ends is selected to produce a desired logic function, and desired wirings are provided for the selected input ends and the output ends of the Josephson-junction logic gates so that the Josephson-junction logic gates are connected.

BRIEF DESCRIPTION OF THE DRAWINGS

The above objects and advantages, as well as the characteristic features of the present invention, will be more apparent from the following description of the preferred embodiments in conjunction with the accompanying drawings, in which.

DETAILED DESCRIPTION OF THE PREFERRED EMBODIMENTS

The embodiments of the invention will be described below with reference to the accompanying drawings in comparison with the conventional art.

Figure 1A:
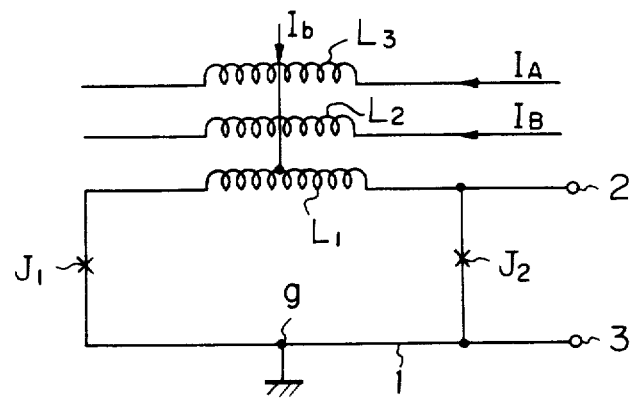
FIG. 1A is an equivalent circuit diagram illustrating a conventional magnetically coupled gate.

FIG. 1A is a diagram of an equivalent circuit of a conventional magnetically coupled OR gate which consists of two Josephson junctions $J_1$ and $J_2$ and an inductance $L_1$ which is connected therebetween. Inductances $L_2$ and $L_3$ are magnetically coupled to the inductance $L_1$ of the superconductive loop 1 which is grounded at a point g. A bias current $I_b$ is supplied to the inductance $L_1$ in the loop, and input currents $I_A$ and $I_B$ are supplied to the inductances $L_2$ and $L_3$ for creating magnetic flux in the loop.

Figure 1B:
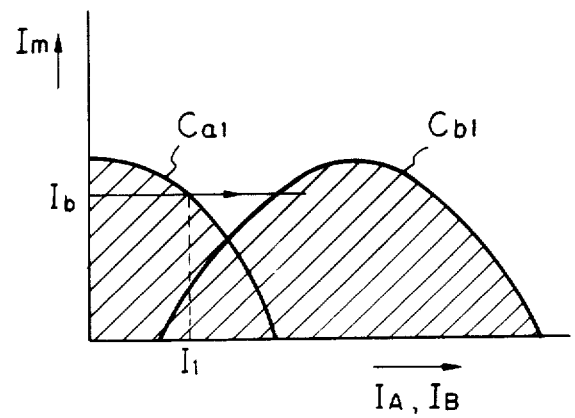
FIG. 1B is a graph showing the threshold characteristics of the circuit of FIG. 1A.

FIG. 1B is a graph showing the relationships between the critical currents and the input currents of the Josephson junctions in the magnetic field-coupled circuit of FIG. 1A. Referring to FIGS. 1A and 1B, it is known that the critical current $I_m$ in the Josephson junction changes as the superconductive loop 1 is magnetically coupled to the magnetic field made by the inductance $L_2$ or $L_3$ owing to the input current $I_A$ or $I_B$. In FIG. 1B, the curves indicated by $C_{a1}$ and $C_{b1}$ represent the relationship between the input current $I_A + I_B$ and the critical current $I_m$. When the bias current $I_b$ is smaller than the critical current $I_m$, indicated by the hatched areas, the gate is in a superconductive state whereby no voltage appears across the output terminals 2 and 3. When the bias current $I_b$ is suitably set as shown so that either the input current $I_A$ or the input current $I_B$ is larger than $I_1$, the Josephson junction assumes the voltage state, whereby a voltage appears across the output terminals 2 and 3. Thus, the circuit of FIG. 1A is used as an OR gate. In the magnetically coupled gate, however, each input current independently changes the critical current and, hence, a small margin is provided for setting a bias current and input currents.

Figure 2A:
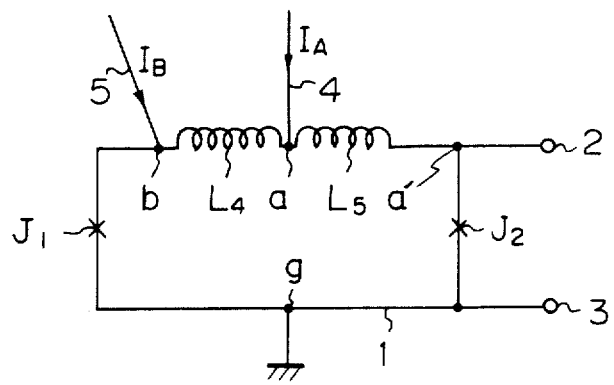
FIG. 2A is an equivalent circuit diagram illustrating a conventional current-injection type gate.

FIG. 2A is a diagram of an equivalent circuit of a conventional current-injection type AND gate, in which inductances $L_4$ and $L_5$ are connected in series in the superconductive loop 1 and current injection lines 4 and 5 are disposed at both ends a and b of the inductance $L_4$ to directly inject the input currents $I_A$ and $I_B$.

Figure 2B:
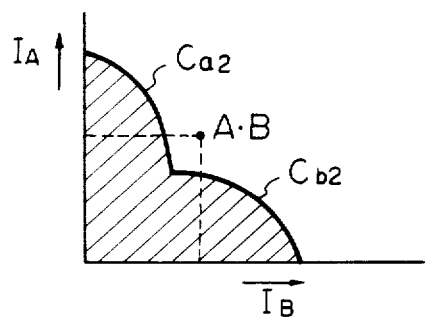
FIG. 2B is a graph showing the threshold characteristics of the circuit of FIG. 2A.

FIG. 2B is a graph illustrating the relationship between the critical current of the Josephson junctions of FIG. 2A and the input currents. In FIG. 2B, the ordinate represents the input current $I_A$ and the abscissa represents the input current $I_B$. When the intersection point of $I_A$ and $I_B$ is in the hatched region, i.e., the current which flows into the superconductive loop 1 is smaller than the predetermined critical current, the gate is in the superconductive state. When the intersection point of $I_A$ and $I_B$ is at a point outside the hatched area, however, the superconductive state is switched to the voltage state. Thus, the circuit of FIG. 2A works as an AND gate. In the current-injection type gate, the state is switched so rapidly relative to the change in the injected current that the operation margin is large. In the two-junction logic gate shown in FIG. 2A, however, the number of inputs is limited to two.

One object of the present invention is to solve the above-mentioned problems existing in the conventional magnetically-coupled and current-injection type Josephson-junction logic gates of FIGS. 1A and 2A.

Figure 3A:
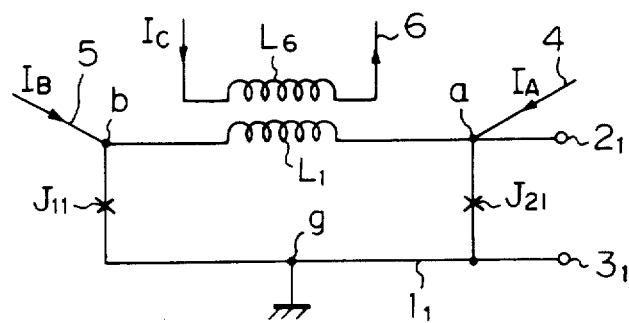
FIG. 3A is an equivalent circuit diagram illustrating a Josephson-junction logic gate according to an embodiment of the present invention.

FIG. 3A is a diagram of an equivalent circuit of a Josephson-junction logic gate according to the first embodiment of the present invention, which gate consists of a superconductive loop $1_1$, identical to the conventional current-injection type superconductive loop 1 of FIG. 2A and a magnetically coupled control line 6 including an inductance $L_6$, which can be magnetically coupled to the superconductive loop $1_1$. Input currents $I_A$ and $I_B$ are injected from the two ends a and b of the inductance $L_1$ in the superconductive loop $1_1$, and a third input current $I_C$ flows through the magnetically coupled control line 6. In this embodiment, the Josephson junctions $J_{11}$ and $J_{21}$ have equal critical current $I_0$, and the product of the inductance $L_1$ and the critical current $I_0$ has been selected to be nearly equal to half a flux quantum $\Phi_0/2$. Here, the flux quantum $\Phi_0$ is equal to $2.07 \times 10^{-15}$ Wb. The product $L_1 I_0$ may not be exactly limited to $\Phi_0/2$ but may be approximately equal to $\Phi_0/2$.

Figure 3B:
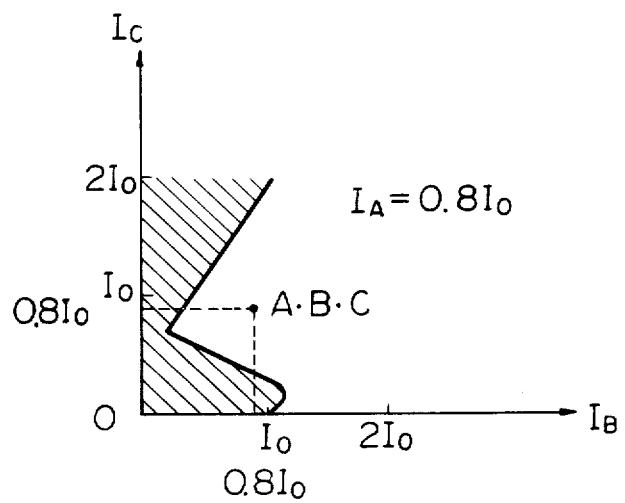
FIGS. 3B through 3D are graphs showing the threshold characteristics of the circuit of FIG. 3A.
Figure 3C:
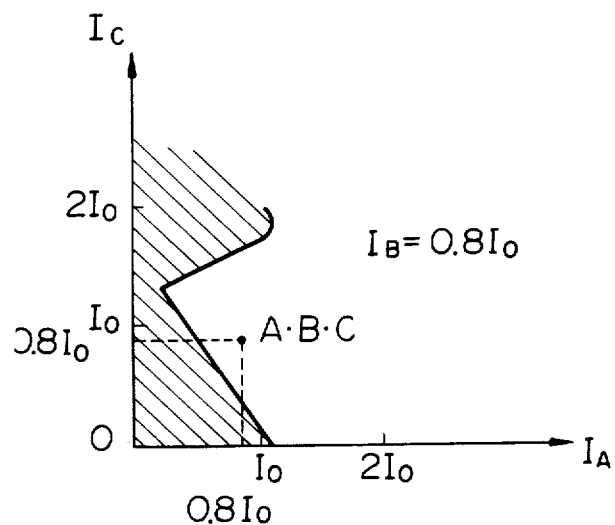
Figure 3D:
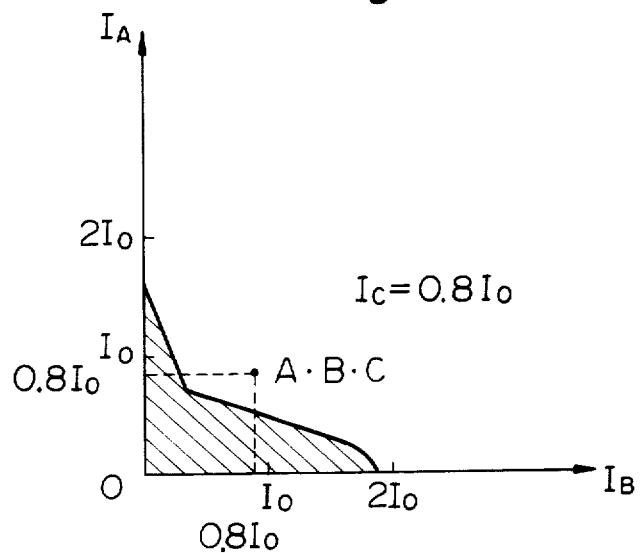

FIGS. 3B through 3D are graphs showing the threshold characteristics of the gate of FIG. 3A. FIG. 3B shows the threshold characteristics for the input currents $I_B$ and $I_C$ when the input current $I_A$ is selected to be 0.8 $I_0$. When either one of the input currents $I_B$ or $I_C$ is 0.8 $I_0$ and the other is zero, the Josephson junctions $J_{11}$ and $J_{21}$ remain in the superconductive state, and the gate is not switched. When the two input currents $I_B$ and $I_C$ are both 0.8 $I_0$, the critical current decreases due to the magnetic field-coupling of the control line 6 with the superconductive loop $1_1$. Therefore, the current flowing through the loop exceeds the threshold value, and the circuit is switched to the voltage state. Accordingly, if the three inputs are denoted by A, B and C, the circuit of FIG. 3A works as a gate for obtaining a logical product A B C. FIG. 3C shows the threshold characteristics when the input current $I_B$ is selected to be 0.8 $I_0$, and FIG. 3D shows the threshold characteristics when the input current $I_C$ is selected to be 0.8 $I_0$. In either case, the circuit is not switched when either one of the two input currents is 0.8 $I_0$ but is switched when the two input currents are 0.8 $I_0$, as in the case of FIG. 3B. In the case of FIGS. 3B through 3D, therefore, the circuit is switched only when all of the input currents $I_A$, $I_B$ and $I_C$ are 0.8 $I_0$. Therefore, the circuit of FIG. 3A produces, across the output terminals 2 and 3, a logical product of the three inputs without impairing the input sensitivity very much. The output may be obtained from the point a or from the point b in the superconductive loop $1_1$.

In practice, the circuit of FIG. 3A does not have the function of isolating the output current from the input currents. That is, in FIG. 3A, the output current flowing through the point a may be drawn through the input control line 4 into a pre-stage gate (not shown). In order to prevent the output current from being drawn into the pre-stage gate, it is necessary to insert a magnetically coupled gate ($J_A$, $J_B$, etc. as in FIG. 4) which respectively isolates the input from the output, between the gate and each pre-stage gate.

Figure 4:
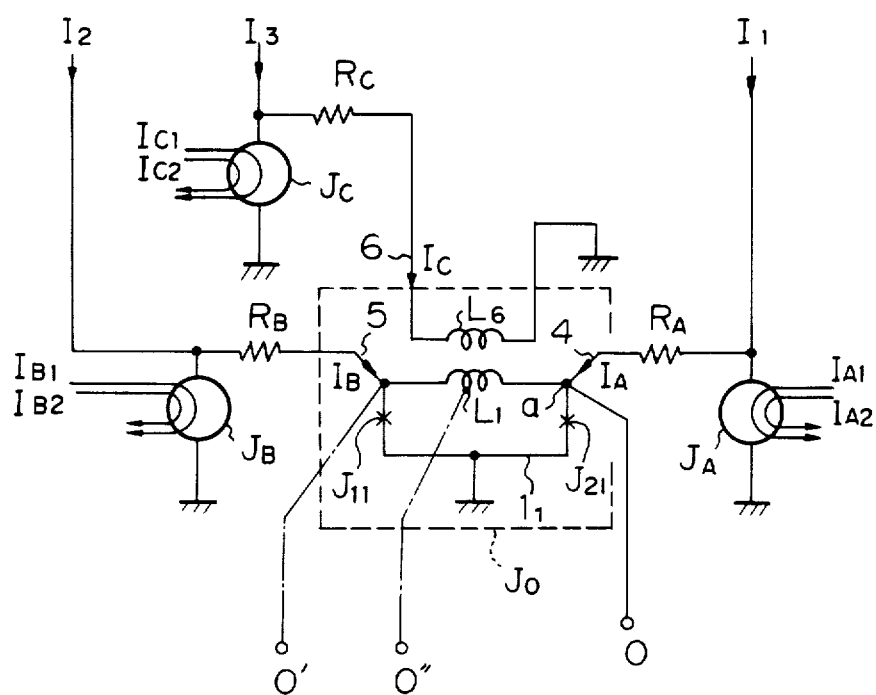
FIG. 4 is a circuit diagram illustrating the circuit in FIG. 3A in which three magnetically coupled gates for isolating the Josephson-junction logic gate from the others have been added to the inputs of the gate.

FIG. 4 is a circuit diagram illustrating a circuit which has the function of separating the input terminal from the output terminal. In FIG. 4, the symbols $J_A$, $J_B$ and $J_C$ denote widely known multi-junction interferometers which produce a logical sum from two inputs. For example, the interferometer $J_A$ receives a bias current $I_1$ and two inputs $A_1$ and $A_2$ having current values $I_{A1}$ and $I_{A2}$, respectively, and produces a logical sum $(A_1 + A_2)$ at its output. The input current $I_A$, which is the output current of the interferometer $J_A$, is obtained through a resistor $R_A$. Since the input lines of the interferometer are magnetically coupled with the output line connected to the resistor $R_A$, the input lines of the inerferometer $J_A$ are electrically isolated from the output line. The other interferometers $J_B$ and $J_C$ have the same function as that of the interferometer $J_A$. Accordingly, from the circuit of FIG. 4, a logic product $(A_1 + A_2) \cdot (B_1 + B_2) \cdot (C_1 + C_2)$ of logical sums is obtained at the output terminal O connected to the point a, each of the logic sums being obtained from two inputs $A_1$ and $A_2$, $B_1$ and $B_2$, or $C_1$ and $C_2$ fed to the interferometer $J_A$, $J_B$ or $J_C$, respectively. The logical product can be obtained alternatively at the output terminal O' or at the output terminal O''.

Although the circuit of FIG. 4 employs multi-junction interferometers for electrically isolating the inputs from the output, it is of course allowable to employ any other gate having the function of electrically isolating the inputs from the output. For instance, use can be made of a gate in which the opposing electrodes are directly coupled together, which gate is disclosed in Japanese Patent Application No. 20214/80 filed earlier than the present application and assigned to the same assignee as in the present application, or use can be made of a DCL (directly-coupled logic) gate.

Further, the control line 6, which is magnetically coupled to the superconductive loop $1_1$, has, by itself, the function of electrically isolating its input from its output. Accordingly, it is allowable to provide a plurality of control lines which are magnetically coupled to inject input signals, thereby omitting the need for a multi-junction interferometer $J_C$ for separating the inputs and outputs.

Figure 5A:
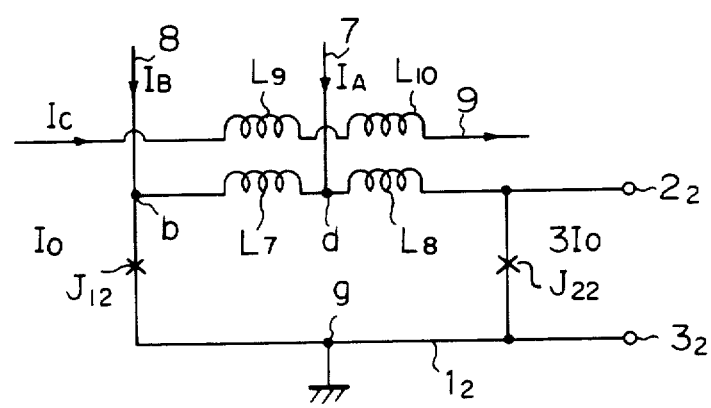
FIG. 5A is an equivalent circuit diagram illustrating a Josephson-junction logic gate according to a second embodiment of the present invention.
Figure 5B:
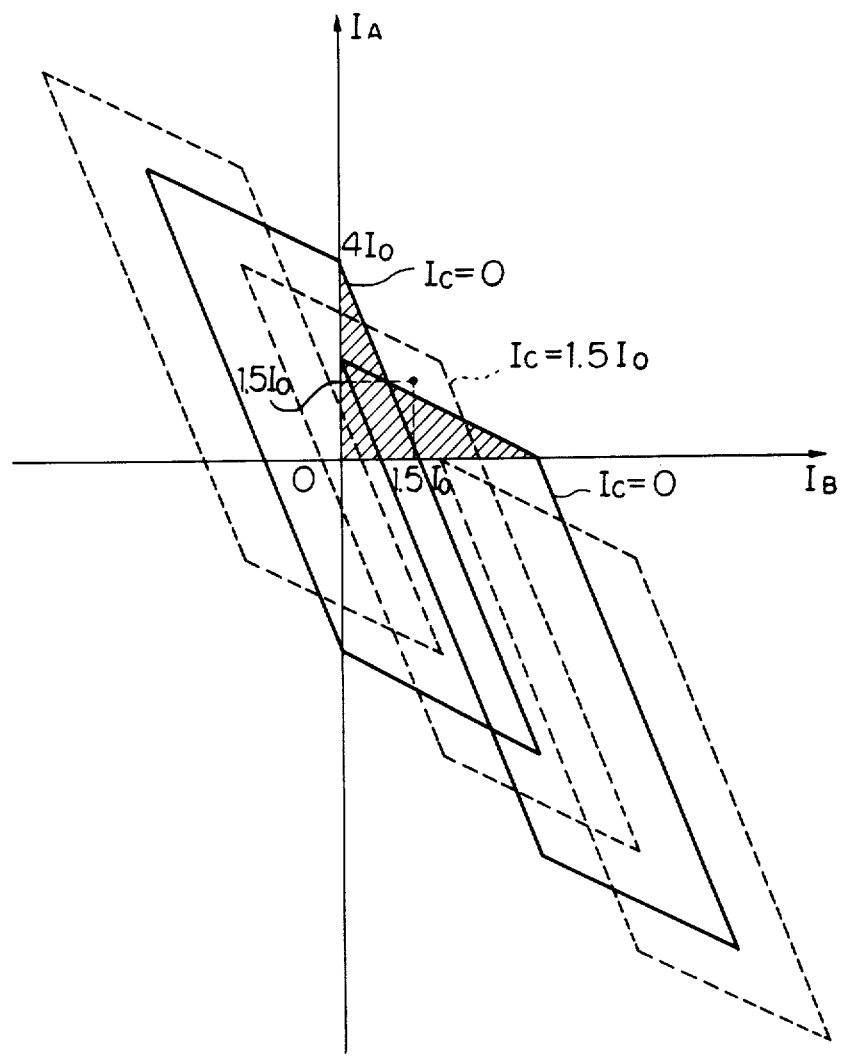
FIG. 5B is a graph showing the threshold characteristics of the circuit of FIG. 5A.

FIG. 5A is an equivalent circuit diagram illustrating a Josephson-junction logic gate according to the second embodiment of the present invention in which the critical currents of Josephson junctions $J_{12}$ and $J_{22}$ in a superconductive loop $1_2$ are $I_0$ and $3I_0$, respectively. Two inductors $L_7$ and $L_8$ are connected in series in the superconductive loop $1_2$. The inductors $L_7$ and $L_8$ consist of an inductance $3L$ and an inductance $L$, respectively. A control line 7 for feeding the input current $I_A$ is connected to a point d between the inductances $L_7$ and $L_8$ in the loop $1_2$. A current-injection line 8 for feeding the input current $I_B$ is connected to the point b, as in the other embodiments. A magnetically-coupled control line 9, for feeding the input current $I_C$, includes two inductances $L_9$ and $L_{10}$ connected in series. The inductances $L_9$ and $L_{10}$ also consists of inductances 3L and L, respectively, and are so disposed as to be magnetically coupled to the inductances $L_7$ and $L_8$. FIG. 5B schematically illustrates the threshold characteristics when the value of the inductance L is set to be $L(=\Phi_0/12)I_0$. For the purpose of simplicity, the threshold characteristics shown in FIG. 5B are represented by polygonal lines. In practice, however, the threshold characteristics are represented by smooth curves as illustrated in FIGS. 1B, 2B and 3B through 3D. The theory for obtaining the threshold characteristic curve will be described at the end of this specification.

In FIGS. 5A and 5B, the state in which the input A assumes the logic level "0" is defined to be $I_A=0$, and the state in which the input A assumes the logic level "1" is defined to be $I_A=1.5\ I_0$. With regard to the inputs B and C, in the same manner, $I_B=0$ and $I_C=0$ represent the state of the logic level "0", and $I_B=1.5\ I_0$ and $I_C=1.5\ I_0$ represent the state of the logic level "1". The solid lines in FIG. 5B illustrate the threshold characteristics when the input C assumes the logic level "0", i.e., when $I_C=0$. In this case, the circuit assumes the voltage state when both the inputs A and B assume the logic level "1", and the logic "1" is produced across the output terminals $2_2$ and $3_2$. The dotted lines illustrate the threshold values when the input C assumes the logic level "1". In this case, the circuit is not switched even when only one of the inputs A and B assumes the logic level "1" or when both of the inputs A and B assume the logic level "1". Therefore, the circuit of FIG. 5A realizes a logic function $A \cdot B \cdot \bar{C}$ from the three inputs A, B and C.

Still another embodiment of the invention in which an ENOR output can be obtained will be described.

Figure 6A:
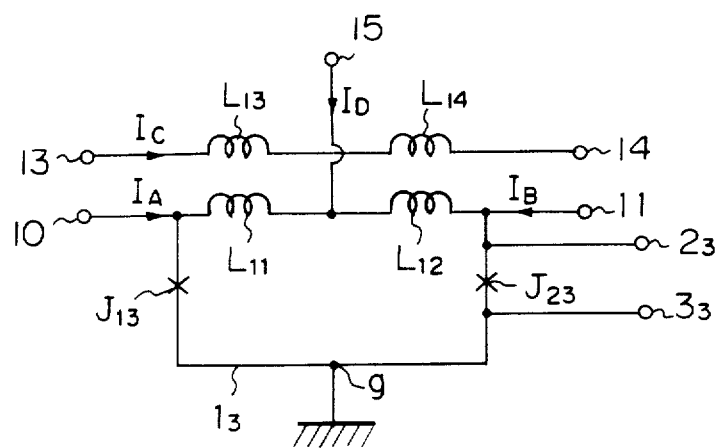
FIG. 6A is an equivalent circuit diagram illustrating a Josephson-junction logic gate according to a third embodiment of the present invention.

FIG. 6A is an equivalent circuit diagram illustrating a Josephson-junction logic gate according to the third embodiment of the present invention in which $J_{13}$ and $J_{23}$ denote Josephson junctions each having a critical current $I_0$, and $L_{11}$ and $L_{12}$ denote inductances in a superconductive loop $l_3$. The superconductive quantum interference element of FIG. 6A has the three current injedtion lines. The sum of inductances $(L_{11}+L_{12})$ is selected to be, for example, about $(\Phi_0/4I_0)$. Here, the sum of the inductance need not be exactly limited to the above value but may be approximately equal to $(\Phi_0/4I_0)$. Reference numerals 10 and 11 denote signal input terminals, and $I_A$ and $I_B$ denote currents supplied through the terminals 10 and 11. The symbols $L_{13}$ and $L_{14}$ denote inductors that are magnetically coupled to the inductors $L_{11}$ and $L_{12}$, and reference numerals 13 and 14 denote the terminals of inductances $L_{13}$ and $L_{14}$. The current supplied to the inductances $L_{13}$ and $L_{14}$ is denoted by $I_C$. Reference numeral 15 denotes a terminal for supplying the bias current denoted by $I_D$. The letter g denotes a ground terminal, and the output signal is produced across the output terminals $2_3$ and $3_3$.

Figure 6B:
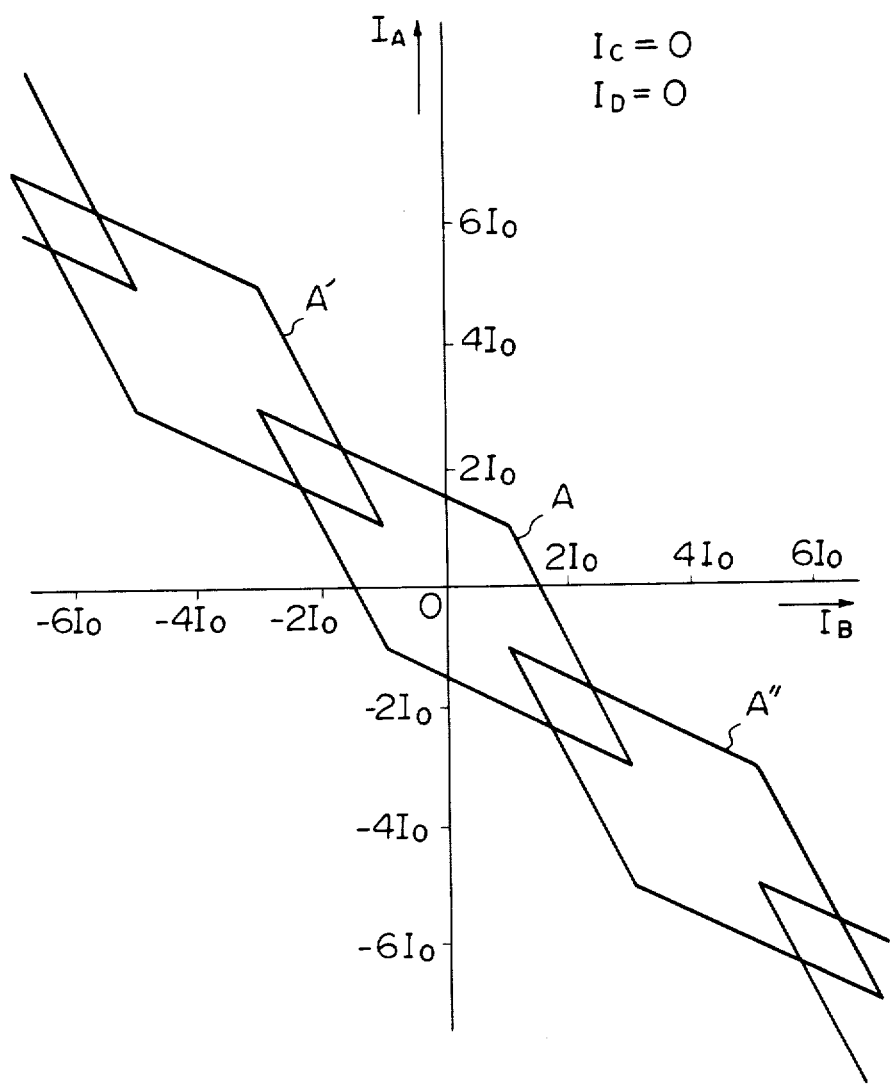
FIG. 6B is a graph showing the threshold characteristics when the current $I_C$ and $I_D$ are both zero in the Josephson-junction logic gate of FIG. 6A.

FIG. 6B is a graph showing the threshold characteristics when the currents $I_C$ and $I_D$ are zero in the Josephson-junction logic gate of FIG. 6A. In FIG. 6B, the abscissa and ordinate represent currents $I_B$ and $I_A$, respectively. The envelopes A, A' and A'' represent threshold characteristics. When the combination of currents $I_A$ and $I_B$ is within any one of the envelopes A, A' and A'', the Josephson junctions $J_{13}$ and $J_{23}$ are in the superconductive state and no voltage appears across the ends of the Josephson junctions $J_{13}$ and $J_{23}$. When the combination of currents $I_A$ and $I_B$ is outside the envelopes A, A' and A'', however, the Josephson junctions $J_{13}$ and $J_{23}$ are in the voltage state, and a voltage appears across the output terminals $2_3$ and $3_3$ at the ends of the Josephson junction $J_{23}$ or across the ends of the Josephson junction $J_{13}$. It is widely known that the threshold characteristics of the Josephson-junction logic gate, i.e., the shapes of the envelopes A, A' and A'', and their mutual positions are determined by the critical current $I_0$ of the Josephson junctions $J_{13}$ and $J_{23}$ and by the inductance L of the inductors $L_{11}$ and $L_{12}$. In this third embodiment, the inputs A and B are logic "0"s, when the currents $I_A$ and $I_B$ are zero, respectively. Also, when the currents $I_A$ and $I_B$ are 1.3 $I_0$, the inputs A and B are logic "1"s, respectively.

The third and fourth input currents $I_C$ and $I_D$ are timing pulse currents for shifting the threshold characteristics of the Josephson-junction logic gate in the direction of 45° in the second and fourth quadrants and in the direction of 45° in the first and third quadrants, respectively.

Figure 6C:
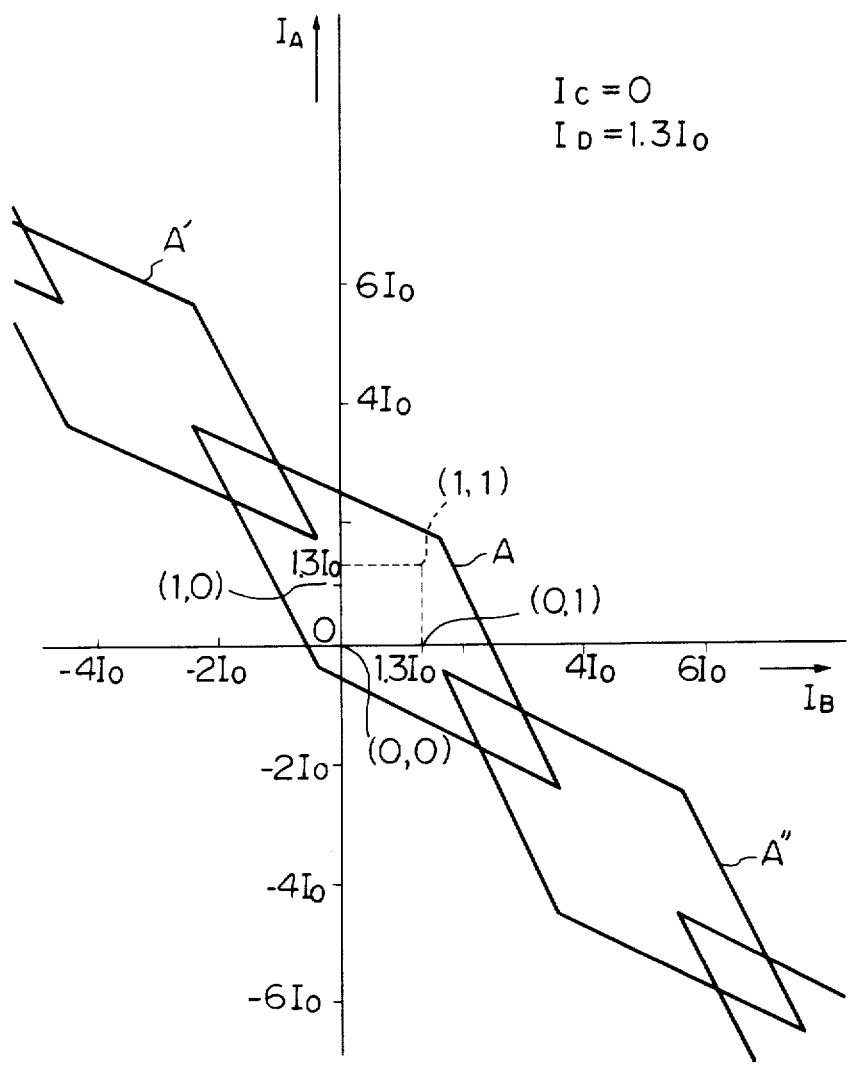
FIG. 6C is a graph showing the threshold characteristics when the current $I_C$ is maintained at zero and when the current $I_D$ only is set to 1.3 $I_O$ in the Josephson-junction logic gate of FIG. 6A.

FIG. 6C is a graph illustrating the threshold characteristics when the current $I_C$ is maintained at zero and the current $I_D$ only is set to be $-1.3\ I_0$ in the Josephson-junction logic gate of FIG. 6A. It will be understood that envelopes A, A' and A'' are shifted in parallel in the direction of 45° in the first quadrant by a distance corresponding to 1.3 $I_0$ due to the supply of the current $I_D$. Here, the first and second input currents $I_A$ and $I_B$ of zero or 1.3 $I_0$ are supplied. Four combinations are possible, i.e., (A, B) = (0, 0), (0, 1), (1, 0) or (1, 1). In all of the cases, the operation point exists in an envelope, as indicated by (0, 0), (0, 1), (1, 0) and (1, 1). Namely, no voltage is generated across the ends of the Josephson element $J_{13}$ or $J_{23}$, and the output voltage is zero in all of the cases.

Figure 6D:
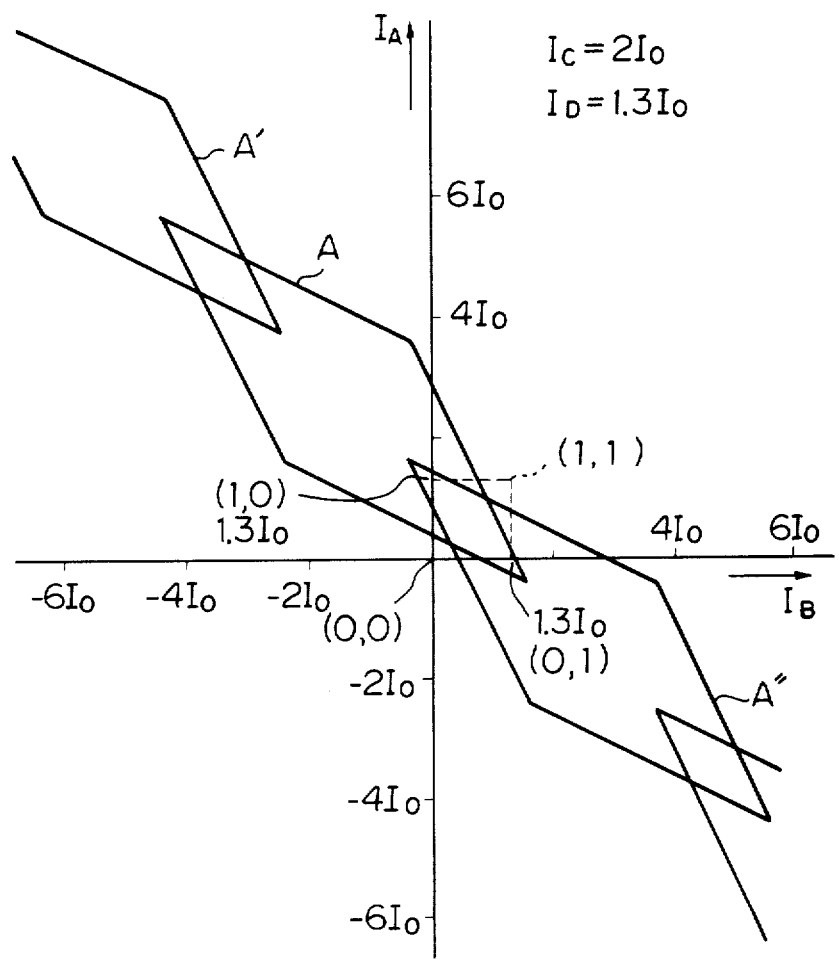
FIG. 6D is a graph showing the threshold characteristics when the current $I_D$ of 1.3 $I_O$ is supplied and the current $I_C$ of 2 $I_O$ is supplied in the Josephson-junction logic gate of FIG. 6A.

FIG. 6D is a graph showing the threshold characteristics when the current $I_D$ of 1.3 $I_0$ is supplied and the current $I_C$ of $2I_0$ is supplied in the Josephson-junction logic gate of FIG. 6A. It will be understood that, with respect to the envelopes A, A' and A'' in FIG. 6C, the envelopes A, A' and A'' in FIG. 6D are shifted in parallel in the direction of 45° in the fourth quadrant by a distance corresponding to $2I_0$ since the current $I_C$ of $2I_0$ is supplied in addition to the current $I_D$. Here, if the first and second input signals $I_A$ and $I_B$, which are zero or 1.3 $I_0$, are supplied before the current $I_C$ is supplied, the operation points in each of the cases will become as shown to produce output signals as given in the following truth table.

| Input A | Input B | Output |
|---------|---------|--------|
| 0 | 0 | 1 |
| 1 | 1 | 1 |
| 1 | 0 | 0 |
| 0 | 1 | 0 |

The above truth table shows that the output is a exclusive NOR logic function of the two inputs, i.e., the output is $(A \cdot \bar{B} + \bar{A} \cdot B)$. It is, therefore, obvious that the Josephson-junction logic gate, which is constructed as mentioned above, serves as a logic gate that produces a logical exclusive NOR of the inputs.

Here, attention should be given to the fact that when the gate is made up of an interferometer having latch-type Josephson junctions, the order for supplying timing pulse currents $I_D$ and $I_C$ and input signal currents $I_A$ and $I_B$ must not be changed. If 1.3 $I_0$ is supplied first as the input signal current $I_A$ and if timing pulse currents $I_D$ and $I_C$ are then supplied, this state corresponds to the input signal (A, B)=(1, 0) where no output should be produced. However, if noise is added to the input signal current $I_A$ before the timing pulse current $I_D$ is supplied and if the value of the input current $I_A$ exceeds 1.5 $I_O$, the interference element of FIG. 6A is switched to produce an output. This fact reduces the operation margin and makes it difficult to sufficiently provide the features of the present invention. However, if the timing pulse currents $I_D$ and $I_C$ are supplied first and if the input signal currents $I_A$ and $I_B$ are then supplied according to the above-mentioned order, the circuit will operate properly even when noise is added to the input signal $I_A$, provided the value of the input signal current $I_A$ does not exceed 2.5 $I_O$, and a sufficiently large operation margin can be obtained.

Still another embodiment of the invention will be described to provide a Josephson-junction logic circuit including commonly arrayed logic gates.

Figure 7A:
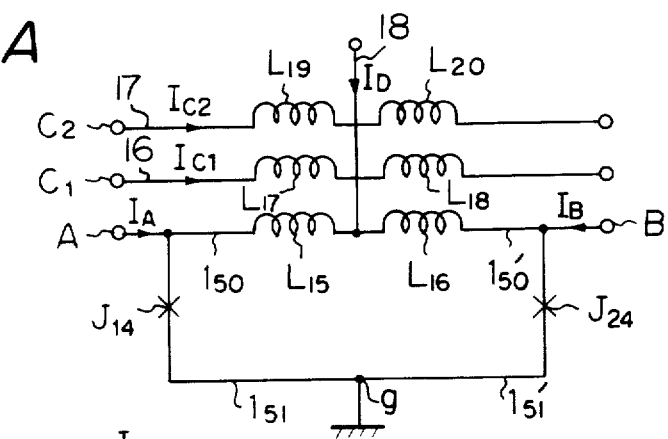
FIG. 7A is an equivalent circuit diagram illustrating a superconductive quantum interference element according to the fourth embodiment of the present invention.
Figure 7B:
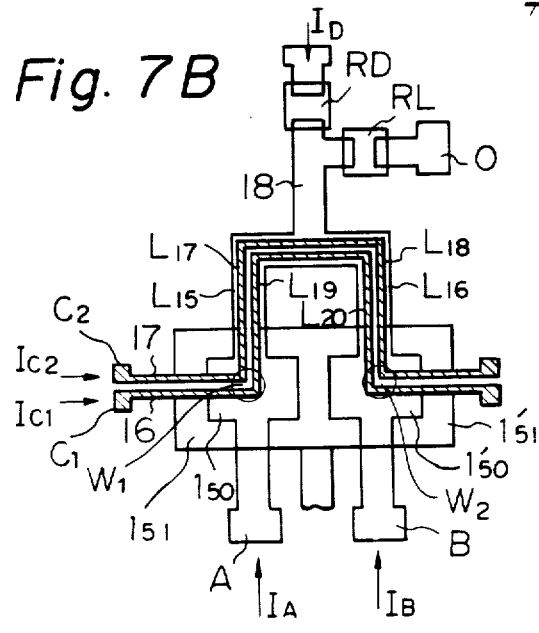
FIG. 7B is a plan view illustrating the physical structure of the superconductive quantum interference element of FIG. 7A.
Figure 7C:
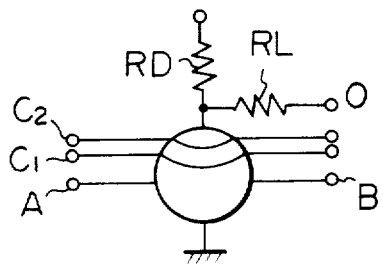
FIG. 7C is a symbolic representation of the superconductive quantum interference element of FIG. 7A.

FIG. 7A is an equivalent circuit diagram illustrating a superconductive quantum interference element according to the fourth embodiment of the present invention, FIG. 7B is a plan view illustrating the physical structure of the superconductive quantum interference element of FIG. 7A and FIG. 7C is a diagrammatic representation of the superconductive quantum interference element of FIG. 7A. The circuit of FIG. 7A is similar to the circuit of FIG. 5A or FIG. 6A. The difference between the circuit of FIG. 7A and the circuit of FIG. 5A or 6A is that, in FIG. 7A, an additional magnetically coupled control line 17 is provided for the purpose of obtaining both an AND gate and an OR gate. Referring to FIGS. 7A and 7B, the superconductive loop includes base electrodes $1_{50}$ and $1_{50}'$ and counter electrodes $1_{51}$ and $1_{51}'$. The base electrodes include inductance $L_{15}$ and $L_{16}$ connected in series. The counter electrodes $1_{51}$ and $1_{51}'$ are grounded. The counter and base electrodes are each composed of a thin superconductive film, such as a lead alloy or the like. At window portions $W_1$ and $W_2$, the base electrodes are opposed to the counter electrodes through thin insulating film (not shown) capable of causing super-conductive tunneling. The thin insulating films are formed by oxidizing the lower electrodes $1_{50}$ and $1_{50}'$. The Josephson junctions $J_{14}$ and $J_{24}$ are thus formed at the window portions $W_1$ and $W_2$. The other portions of the electrodes, except for the window portions $W_1$ and $W_2$, are insulated by a thick insulating film (not shown) composed of silicon oxide (SiO) or the like. Reference numerals 16 and 17 denote magnetically coupled control lines. The control line 16 has inductances $L_{17}$ and $L_{18}$ which are connected in series. The control line 17 has inductances $L_{19}$ and $L_{20}$ which are connected in series. These control lines 16 and 17 are formed through an insulating film (not shown) under the base electrodes $1_{50}$ and $1_{50}'$ so as to be magnetically coupled to the inductors $L_{15}$ and $L_{16}$.

Reference numeral 18 denotes a bias line, and the symbols RD and RL denote a bias-supplying resistor and an output resistor, respectively. The symbols A and B denote terminals of the lower electrodes $1_{50}$ and $1_{50}'$, $C_1$ and $C_2$ denote terminals of the magnetically coupled control lines 16 and 17, and O denotes an output terminal.

The symbols $I_A$ and $I_B$ denote input currents which are supplied to the base electrodes $1_{50}$ and $1_{50}'$, respectively. Control currents $I_{C1}$ and $I_{C2}$, flow through the magnetically coupled lines 16 and 17, respectively. A bias current $I_D$ flows through the bias line.

The Josephson logic gate illustrated in FIGS. 7A and 7B has four input terminals, i.e., terminals A and B of the base electrodes $1_{50}$ and $1_{50}'$ and terminals $C_1$ and $C_2$ of the magnetically coupled control lines 16 ang 17. An AND gate or an OR gate can be formed by selecting a combination of the four input terminals. That is, the logic gate works as an OR gate when the bias current $I_D$ is allowed to flow into the bias line 18 and when signal currents $IC_1$ and $IC_2$ are fed to the magnetic field-coupled control lines 16 and 17. The logic gate also works as an AND gate when an offset current $IC_1$ (or $IC_2$) is allowed to flow into the terminal $C_1$ (or $C_2$) of the magnetic field-coupled control line 16 (or 17) and when signal currents are fed to the input terminals A and B.

Figure 8A:
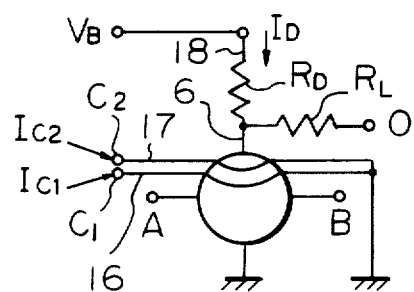
FIG. 8A is a symbolic representation of a circuit when the superconductive quantum interference element of FIG. 7A is used as an OR gate.

FIG. 8A is a symbolic representation of the OR gate obtained as mentioned above with reference to FIGS. 7A through 7C and FIG. 8B is a diagram illustrating the threshold characteristics thereof. In this case, the bias current $I_D$ is allowed to flow into the bias line 18 by applying a bias voltage $V_B$ to the bias line 18 and signal currents $I_{C1}$ and $I_{C2}$ are allowed to flow into the terminals $C_1$ and $C_2$ that serve as input terminals.

Figure 8B:
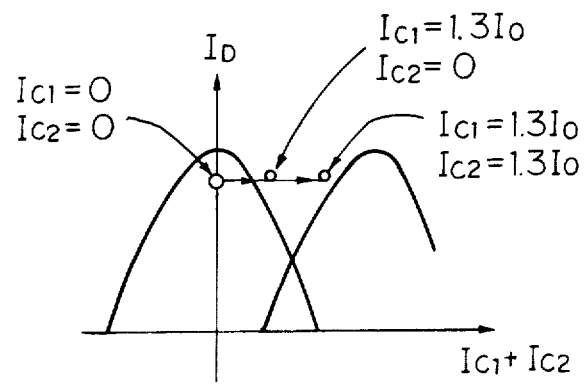
FIG. 8B is a graph showing the threshold characteristics of the element of FIG. 8A.

When either one or both of the signal currents $I_{C1}$ and $I_{C2}$ are 1.3 $I_O$, the circuit assumes the voltage state, as shown in FIG. 8B. When the two signal currents $I_{C1}$ and $I_{C2}$ are zero, the circuit assumes the superconductive state. Namely, a logic sum of the two inputs $C_1$ and $C_2$ is produced at the output terminal O.

Figure 9A:
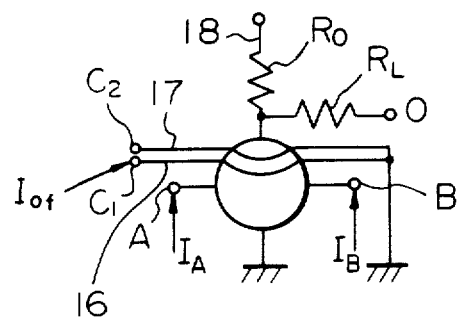
FIG. 9A is a symbolic representation of a circuit when the superconductive quantum interference element of FIG. 7A is used as an AND gate.

FIG. 9A is a symbolic representation of the AND gate obtained as mentioned above with reference to FIGS. 7A through 7C, and FIG. 9B is a diagram showing the threshold characteristics thereof. In this case, an offset current $I_{of}$ is supplied to the magnetic field-coupled control line 16 or 17 and signal currents $I_A$ and $I_B$ are supplied to the base electrodes $1_{50}$ and $1_{50}'$ through the terminals A and B that serve as the two input terminals.

Figure 9B:
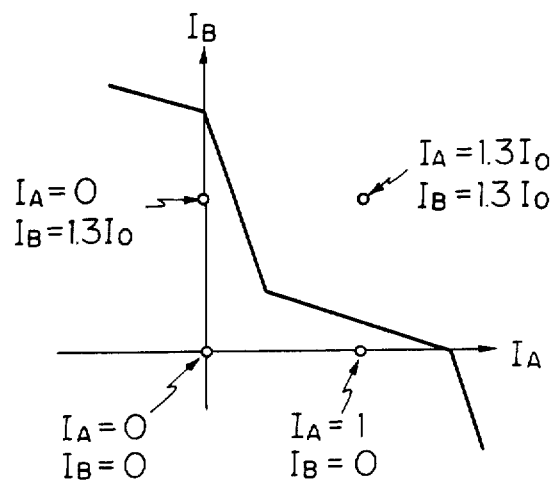
FIG. 9B is a graph showing the threshold characteristics of the element of FIG. 9A.

Here, the circuit assumes the voltage state when the signal currents $I_A$ and $I_B$ are both 1.3 $I_O$ and assumes the superconductive state in other cases, as shown in FIG. 9B. That is, a logical product of the two inputs A and B is produced at the output terminal O.

Therefore, either the AND gate or the OR gate can be constituted by selecting, on the one hand, the desired threshold characteristics, the selection being effected by supplying an offset current $I_{of}$ to either one of the magnetically coupled control lines 16 or 17 or by supplying a bias current $I_D$ to the bias line 18, and by selecting on the other hand, the input terminals that are to be used.

Figure 10:
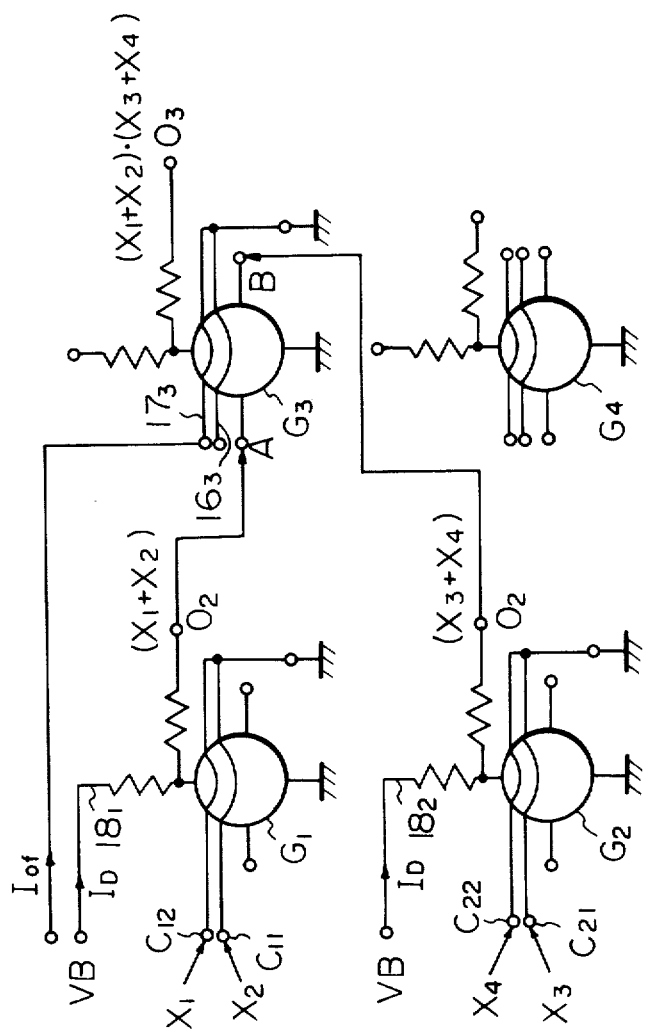
FIG. 10 is a circuit diagram illustrating a Josephson-junction logic circuit according to the fifth embodiment of the present invention.

FIG. 10 is a circuit diagram illustrating a Josephson-junction logic circuit according to the fifth embodiment of the present invention. In FIG. 10, a plurality of Josephson-junction logic gates $G_1, G_2, G_3, G_4, \ldots$, each consisting of a superconductive quantum interference element having variable threshold characteristics, are arrayed in the form of a matrix. The bias lines $18_1$ and $18_2$ of the gates $G_1$ and $G_2$ respectively, are connected to a bias voltage source VB, and a bias current ID is supplied to each of the bias lines $18_1$ and $18_2$. Thus, each of the gates $G_1$ and $G_2$ is constituted as a an OR gate in the same way as in FIG. 9A, while, with respect to the gate $G_3$, an offset current $I_{of}$ is fed to either one of the magnetically coupled control lines $16_3$ and $17_3$ of the gate $G_3$. The output terminals $O_1$ and $O_2$ of the gates $G_1$ and $G_2$ are connected to the input terminals $A_3$ and $B_3$ of the lower electrodes of the gate G. Thus, the gate $G_3$ is constituted as an AND gate in the same way as in FIG. 9A. When inputs $X_1$ and $X_2$ are supplied to the input terminals $C_{11}$ and $C_{21}$ of the OR gate $G_1$ and when inputs $X_3$ and $X_4$ are supplied to the input terminals $C_{12}$ and $C_{22}$ of the OR gate $G_2$, a logic sum $(X_1+X_2)$ is obtained at the output terminal $O_1$ of the OR gate $G_1$ and a logic sum $(X_3+X_4)$ is obtained at the output terminal $O_2$ of the OR gate $G_2$. Accordingly, a logic product $(X_1+X_2)\cdot(X_3+X_4)$ is obtained at the output terminal $O_3$ of the AND gate $G_3$. Therefore, the circuit of FIG. 10 is a logic circuit for obtaining the logic product $(X_1+X_2)\cdot(X_3+X_4)$ from the inputs $X_1$, $X_2$, $X_3$, and $X_4$.

Figure 11:
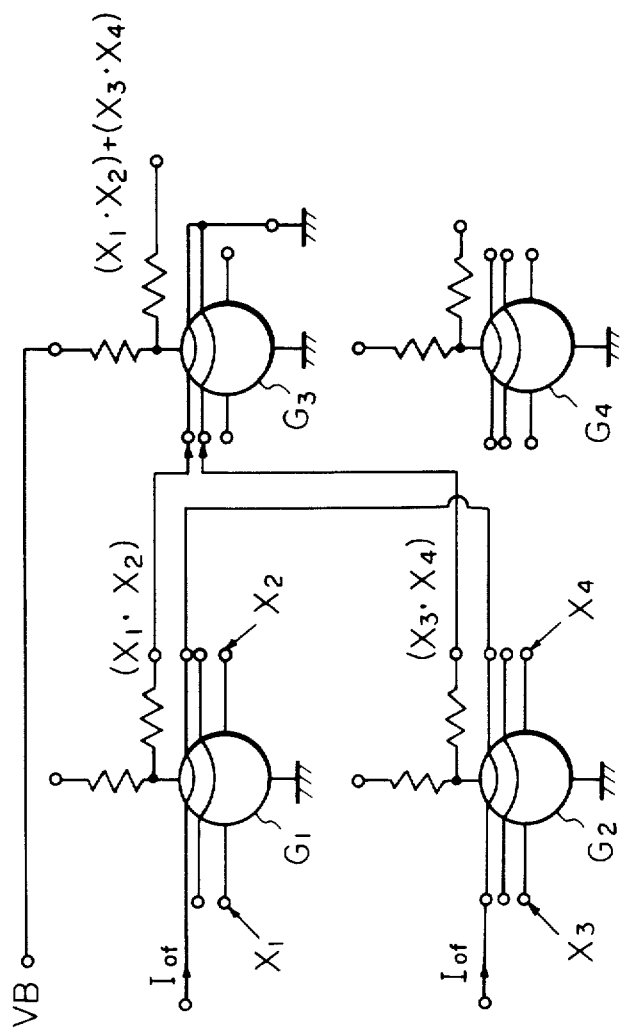
FIG. 11 is a circuit diagram illustrating a Josephson-junction logic circuit according to the seventh embodiment of the present invention.

FIG. 11 is a circuit diagram illustrating a Josephson-junction logic circuit according to the sixth embodiment of the present invention. In FIG. 11, the gates $G_1$ and $G_2$ are utilized as AND gates, and the gate $G_3$ is utilized as an OR gate among the Josephson-junction logic gates $G_1$, $G_2$, $G_3$, $G_4$, . . . . This embodiment produces a logic sum of two logic products $X_1\cdot X_2$ and $X_3\cdot X_4$ from two sets of inputs $X_1$ and $X_2$ and $X_3$ and $X_4$, i.e., a logic sum $(X_1\cdot X_2+X_3\cdot X_4)$.

In the fifth and sixth embodiments, the superconductive quantum interference elements of the same construction having variable threshold characteristics are arrayed in the form of a matrix, and desired wirings are provided. Each of the elements has two lower electrodes that serve as input terminals, two magnetically coupled control lines, one bias line, and one output terminal. To constitute a predetermined Josephson logic circuit using the elements as desired logic gates, the wirings are connected to terminals that are selected depending upon the desired logic gates.

Therefore, the first and second embodiments can be realized by simply modifying only the wiring pattern without changing the arrangement or construction of the logic gates.

Finally, the theory for obtaining a graph representing threshold characteristics will be described with reference to FIGS. 12A through 12D.

Figure 12A:
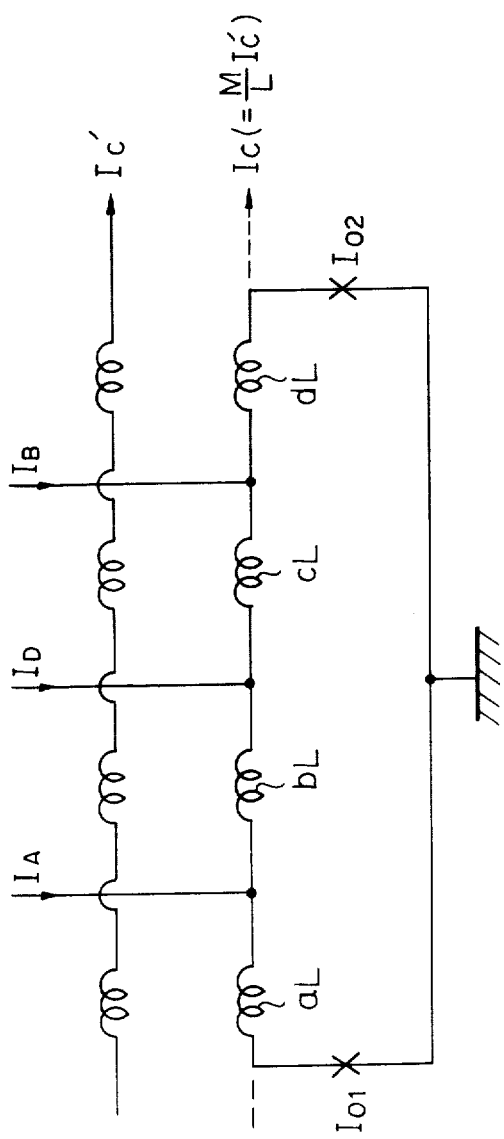
FIG. 12A is an equivalent circuit diagram illustrating a variable threshold logic gate for explaining the threshold characteristic.
Figure 12:
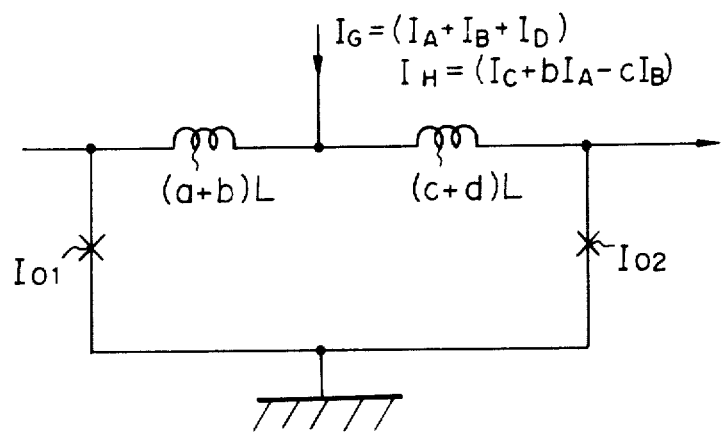
FIG. 12B is a further equivalent circuit diagram of FIG. 12A.
FIG. 12C is a graph illustrating one aspect of the threshold characteristics of the circuit of FIG. 12B.
FIG. 12D is a graph illustrating another aspect of the threshold characteristics of the circuit of FIG. 12C.
Figure 12:
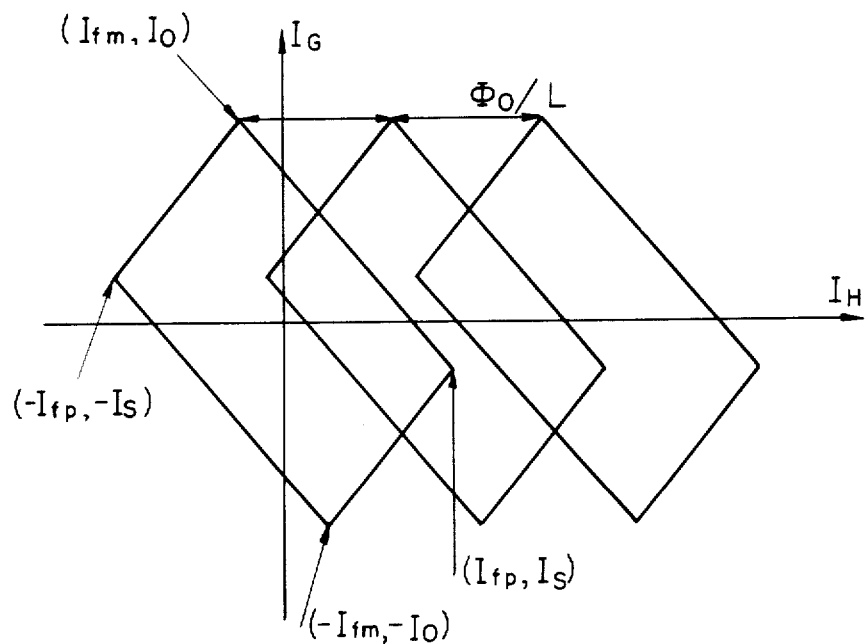

FIG. 12A illustrates an equivalent circuit diagram of a variable threshold logic gate in which two Josephson-junctions having critical currents $I_{01}$ and $I_{02}$ are connected through the four inductances which sum to L. Three terminals ($I_A$, $I_D$, and $I_B$) for injecting currents are provided at points that divide the inductance L into a:b:c:d ($a+b+c+d=1$), and a current $I_c'$ is supplied to a control line that is coupled to the loop through mutual inductance M. The same holds true when the expression $I_c(=(M/L)I_c')$ is employed instead of $I_c'$.

The conventional current-injection type is established when currents $I_A$ and $I_B$ only are supplied, and a two-junction, magnetically coupled SQUID is established when $I_D$ and $I_C$ are supplied or when $I_A$ (or $I_B$) and $I_C$ are supplied.

The following expressions are a Kirchhoff's equation which represents the zero-voltage state of the equivalent circuit of FIG. 12A, and an equation that represents the quantizing condition for a quantum interference element.

$$I_G = I_A + I_B + I_D = I_{01} \sin \phi_1 + I_{02} \sin \phi_2 \quad (1)$$

$$\phi_1 - \phi_2 + (2\pi/\phi_0)\cdot\Phi = 0 \quad (2)$$

where $\phi_1$ and $\phi_2$ represent phase differences of Josephson junctions, and $\Phi_0$ represents the flux quantum ($h/2e = 2.07 \times 10^{-15}$ wb, where h denotes Planck's constant, and e denotes electronic charge). Further, $\Phi$ denotes the total magnetic flux which crosses the loop and which is given by $$\Phi = (a+b)LI_{01} \sin \phi_1 - bLI_A - (c+d)LI_{02} \sin \phi_2 + CLI_B - LI_C \quad (3)$$

When $I_A$, $I_B$, $I_C$ and $I_D$ are given, $\phi_1$ and $\phi_2$ and $\phi$ are found from the equations (1) through (3), where a minimum value of current in a range where solutions exist define the threshold characteristics. For instance, the threshold characteristics on a plane $I_B$–$I_A$ can be obtained if a maximum value and a minimum value of $I_B$ are found by changing $I_A$ while setting $I_C$ and $I_D$ constant. Generally speaking, a curved surface of threshold values exists in a four-dimensional space of $I_A$, $I_B$, $I_C$ and $I_D$, from which threshold characteristics are obtained corresponding to various combinations of the variables. The shape representing the threshold characteristics can be determined by $I_{01}$ and $I_{02}$ or by a, b, c and d.

The equation (3) can be written as follows if the order of the terms in the equation (3), is changed, $$\Phi = (a+b)LI_{01} \sin \phi_1 - (c+d)LI_{02} \sin \phi_2 - LI_H \quad (3')$$

where $I_H = I_C + bI_A - CI_B$

The equations (1), (2), (3') are the same ones as in the case of the field-coupled circuit shown in FIG. 12A, which circuit diagram is a further equivalent circuit diagram of FIG. 12A. The threshold characteristics of the circuit of FIG. 12B have a well-known periodically occurring shape. FIG. 12C shows these characteristics approximated by polygonal lines. The following expressions (5) through (7) represent the meaning of the symbols at coordinate points in FIG. 12B.

$$I_o = I_{01} + I_{02} \quad (4)$$

$$I_s = I_{01} - I_{02} \quad (5)$$

$$I_{fp} = (\Phi_0/2L) + (a+b)I_{01} + (c+d)I_{02} \quad (6)$$

$$I_{fm} = (a+b)I_{01} - (c+d)I_{02} \quad (7)$$

FIG. 12C is a graph illustrating one aspect of the threshold characteristics of the circuit of FIG. 12B.

Figure 12D:
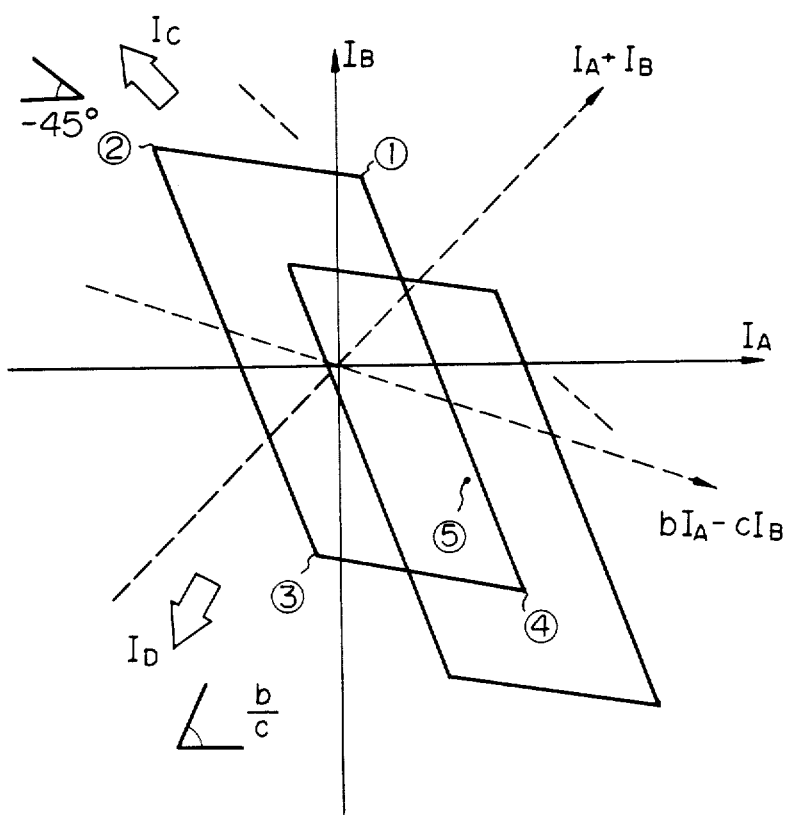

Since $I_G$ and $I_H$ include four currents $I_A$, $I_B$, $I_C$ and $I_D$, the threshold characteristics of the variable threshold logic gate of FIG. 12B can be easily obtained by geometrically shifting the coordinates of the diagram of FIG. 12B. For example, when $I_C = 0$ and $I_D = 0$, the characteristics of FIG. 12C can be written onto a plane $I_B$–$I_A$, as illustrated in FIG. 13D. The characteristics in FIG. 13D appear endlessly along a line of $-45°$, maintaining the same shape of mode and an equal distance. In FIG. 12D, two modes of the characteristics are shown. Reference numerals ① through ④ denote coordinates of four corners of a parallelogram which represent the threshold characteristics of the first mode. Reference numeral ⑤ denotes the coordinate of the center of the parallelogram of the second mode. The two arrows indicate the directions in which the parallelogram is shifted in parallel when $I_C$ and $I_D$ are supplied, respectively. When $I_C$ and $I_D$ are both zero, the coordinates ①, ②, ③, ④, and ⑤ can be expressed in the following way:

$$\left( \frac{CI_0 + I_{fm}}{b+c} + \alpha, \frac{bI_0 - I_{fm}}{b+c} + \beta \right) \quad ①$$

$$\left( \frac{-CI_s - I_{fp}}{b+c} + \alpha, \frac{-bI_s + I_{fp}}{b+c} + \beta \right) \quad (2)$$

$$\left( \frac{-CI_0 - I_{fm}}{b+c} + \alpha, \frac{-bI_0 + I_{fm}}{b+c} + \beta \right) \quad (3)$$

$$\left( \frac{-CI_s + I_{fp}}{b+c} + \alpha, \frac{bI_s - I_{fp}}{b+c} + \beta \right) \quad (4)$$

$$\left( \frac{1}{b+c} \times \frac{n\Phi_0}{L} + \alpha, \frac{1}{b+c} \times \frac{n\Phi_0}{L} + \beta \right) \quad (5)$$

where, $$\alpha = \frac{-CI_D - I_C}{b+c}, \beta = \frac{-bI_0 + I_C}{b+c},$$

and n represents the number of the mode. It will be understood that the threshold characteristics will be shifted in parallel in the direction of $-45°$ when the current $I_C$ is supplied and will be shifted in the direction of the line tilted by b/c when the current $I_D$ is supplied. The amount of shift can be continuously changed in proportion to $I_D$ or $I_C$. Therefore, the threshold characteristics on the plane $I_B$–$I_A$ can be shifted in parallel to any position relying upon $I_C$ and $I_D$.

From the foregoing description, it will be apparent that, according to the present invention, the number of inputs for a Josephson-junction logic gate can be increased in comparison with the prior art, without seriously impairing the input sensitivity, by providing magnetic field-coupled control lines for injecting input signals to the current injection-type Josephson-junction gate.

Further, according to the present invention, an exclusive NOR gate can be provided by utilizing a Josephson-junction logic gate constructed by a single superconductive interference element.

Still further, according to the present invention, there is provided a Josephson logic circuit which is capable of forming different logic circuits simply by changing the photomask for the wiring without changing the arrangement or the construction of the logic gates. Consequently, the Josephson logic circuit can be prepared, modified, or corrected very easily.

The present invention should be in no way be limited to the gates for obtaining logic functions, illustrated by way of the above-mentioned embodiments, but encompasses various other modifications. For example, in the Josephson-junction logic gate illustrated in FIGS. 5A and 6A, varying bias current may be fed to the superconductive loop, the bias current may be supplied at various points, or the Josephson junctions may have various critical currents.

Also, in the fifth and sixth embodiments illustrated in FIGS. 10 and 11, the number of inputs of each Josephson-junction logic gate is two. However, the number of inputs need not be limited to two. It is, of course, allowable to provide three or more magnetic field-coupled control lines and three or more lower electrodes so as to increase the number of inputs.

Furthermore, the Josephson-junction logic gates and logic functions used as elements for constituting the Josephson logic circuit as illustrated in FIGS. 10 and 11 need not be limited to the OR gates and AND gates mentioned in the fifth and sixth embodiments but may be Josephson-junction logic gates having other functions, such as an exclusive NOR gate or the like.

We claim:

1. A Josephson-junction logic circuit comprising:
   a plurality of Josephson-junction logic gates each including a superconductive inductance loop including an inductance and at least two Josephson junctions in said superconductive inductance loop;
   each said logic gate having:
      at least two current-injection lines for receiving at least two respective independent input signal currents to be injected at at least two respective different points of said superconductive inductance loop; and
      at least one magnetically coupled line, each placed so as to be magnetically coupled to said superconductive inductance loop and adapted for receiving a respective input signal current,
      each said logic gate having a respective threshold characteristic which is selectively shifted according to the respective input signal currents, and a selected logic function of said input signal currents being accordingly provided as an output of each said logic gate depending on the values of said input signal currents,
      each said logic gate having at least three inputs corresponding to said input signal currents and at least one output corresponding to the respective output logic function, a combination of at least two of the three inputs being selected to produce a desired logic function for each said logic gate, and wirings being coupled to said selected inputs and said outputs of said logic gates so that a predetermined logic function is output from the logic circuit.

2. A Josephson-junction logic circuit as set forth in claim 1, wherein in each said logic gate,
   the number of said Josephson junctions is two, and said Josephson junctions have a substantially equal critical current,
   the number of said current-injection lines is two, said two current-injection lines receiving first and second respective ones of the input signal currents, and said current-injection lines are connected at respective ends of said inductance of the superconductive inductance loop, and
   the number of said magnetically coupled lines is one, and said respective input signal current of said magnetically coupled line is a third input signal current.

3. A Josephson-junction logic circuit as set forth in claim 1, wherein, in each said logic gate,
   the number of said Josephson-junctions is two, and said Josephson junctions have critical currents at a ratio of substantially 1 to 3,
   the number of said current-injection lines is two, said current-injection lines being connected at points that divide said inductance of said superconductive inductance loop at a ratio of substantially 3 to 1, and said current-injection lines receive respectively a first respective input signal current A and a second respective input signal current B of said input signal currents,
   the number of said magnetically coupled lines is one, and said magnetically coupled line is adapted to receive a third input signal current C of said input signal currents and
said logic function is A·B·C̄.

4. A Josephson-junction logic circuit as set forth in claim 1, wherein, in each said logic gate,
the number of said Josephson junctions is two, and said Josephson junctions have substantially equal critical currents,
the number of said current-injection lines is two, and said current-injection lines are connected at respective ends of the inductance of said superconductive inductance loop,
the number of said magnetically coupled lines is one, and said magnetically coupled line and the point which divides equally said inductance of said superconductive inductance loop are adapted to receive a first and a second timing pulse current, respectively, as respective ones of said input signal currents,
said current-injection lines are adapted to receive first and second input currents as further respective ones of the input signal currents, after said timing pulse currents are supplied to said magnetically coupled line and said inductance, and
said logic function is an exclusive NOR function of said first and second input currents.

5. A Josephson-junction logic circuit as set forth in claim 1, comprising two of said logic gates wherein,
in each said logic gate, the number of said Josephson junctions is two, said Josephson junctions have substantially equal critical currents, the number of said current-injection lines is two, said current-injection lines are connected at both ends of said inductance of the respective superconductive inductance loop, and the number of said magnetically coupled lines is two,
in a first of said two logic gates, said two magnetically coupled lines are adapted to receive respective ones of said input signal currents, and the point which divides equally said inductance of the respective superconductive inductance loop is adapted to receive a bias current, wherein the logic function is that of an OR gate, and
in the second of said two logic gates, one of said two magnetically coupled lines is adapted to receive an offset current as the respective one of said input signal currents, wherein the logic function is that of an AND gate.

6. A Josephson-junction logic circuit as set forth in claim 5, further comprising two additional of said Josephson-junction logic gates wherein the logic function for each is that of an OR gate, wherein the logic function outputs of the two OR gates are provided as selected ones of said input signal currents of said AND gate.

7. A Josephson-junction logic circuit as set forth in claim 1, 2, 3 or 4, wherein said superconductive inductance loop has a grounded point.

8. A Josephson-junction logic circuit as set forth in claim 1, 2, 3 or 4 wherein each said logic gate comprises a variable threshold quantum interference element.

9. The Josephson-junction logic circuit of claim 1, wherein a first one of said logic gates has three of said current injection lines and one of said magnetically coupled lines, wherein said at least one logic gate corresponds to a two junction magnetically coupled superconductive quantum interference element.

10. The Josephson-junction logic circuit of claim 1, wherein said at least one logic gate has three of said current injection lines and two of said magnetically coupled lines, wherein said at least one logic gate is provided with respective ones of said input signal currents so as to provide a selected one of an AND and an OR gate as said logic function.

11. The Josephson-junction logic circuit of claim 1, wherein said at least one logic gate has a threshold characteristic which is shifted depending on said input signal currents.

12. A Josephson-junction logic gate comprising:
a first series circuit including a first Josephson-junction and a first inductance connected in series at a connecting point;
a second series circuit including a second Josephson-junction and a second inductance connected in series at a connecting point, said first and second series circuits being connected to each other at first and second common connection points to form a loop;
a third inductance magnetically coupled to said first and second inductances, the first of said common connection points being grounded, the second of said common connection points being between said first and second inductances, said third inductance being adapted to receive a first timing pulse current, the second common connection point being adapted to receive a second timing pulse current, the connecting points between said first Josephson-junction and said first inductance, and between said second Josephson-junction and said second inductance, being adapted to receive independent first and second input signal currents, respectively, after said first and second timing pulse currents are supplied, a logic exclusive NOR function of said first and second input signal currents being output from said logic gate.

13. The Josephson-junction logic circuit of claim 12, wherein said logic gate has a threshold characteristic which is selectively shifted depending on said first and second timing pulse currents.

* * * * *

UNITED STATES PATENT AND TRADEMARK OFFICE
CERTIFICATE OF CORRECTION

PATENT NO. : 4,713,562

DATED : December 15, 1987

INVENTOR(S) : SHINYA HASUO ET AL.

It is certified that error appears in the above-identified patent and that said Letters Patent is hereby corrected as shown below:

```
Column 1, line 34,   "change" should be --changes--.
Column 7, line 42,   "injedtion" should be --injection--.
Column 12, line 26,  "12A" should be --12B--;
           line 34,  "12B" should be --12C--;
           line 51,  "13D" should be --12D--;
           line 52,  "13D" should be --12D--.
Column 13, line 50,  delete "be" (first occurrence).
```

Signed and Sealed this

Fifth Day of July, 1988

Attest:

DONALD J. QUIGG

Attesting Officer        Commissioner of Patents and Trademarks